United States Patent
Ning

(10) Patent No.: US 10,170,567 B2
(45) Date of Patent: *Jan. 1, 2019

(54) HIGH VOLTAGE LATERALLY DIFFUSED MOSFET WITH BURIED FIELD SHIELD AND METHOD TO FABRICATE SAME

(71) Applicant: International Business Machines Corporation, Armonk, NY (US)

(72) Inventor: Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/792,923

(22) Filed: Oct. 25, 2017

(65) Prior Publication Data

US 2018/0047816 A1 Feb. 15, 2018

Related U.S. Application Data

(62) Division of application No. 15/205,043, filed on Jul. 8, 2016, now Pat. No. 10,038,061.

(51) Int. Cl.
*H01L 29/78* (2006.01)
*H01L 29/66* (2006.01)
(Continued)

(52) U.S. Cl.
CPC .......... *H01L 29/407* (2013.01); *H01L 21/265* (2013.01); *H01L 29/1095* (2013.01);
(Continued)

(58) Field of Classification Search
CPC ... H01L 29/408; H01L 21/265; H01L 29/401; H01L 29/1095;
(Continued)

(56) References Cited

U.S. PATENT DOCUMENTS 5,438,220 A 8/1995 Nakagawa et al.
6,107,160 A 8/2000 Hebert et al.
(Continued)

OTHER PUBLICATIONS

L. Labate et al., "Hot-hole-induced dielectric breakdown in LDMOS transistors," IEEE Transactions on Electron Devices, vol. 50, No. 2, 2003, pp. 372-377.

(Continued)

*Primary Examiner* — Marcos D Pizarro
*Assistant Examiner* — Nelson Garces
(74) *Attorney, Agent, or Firm* — Harrington & Smith; Louis Percello

(57) ABSTRACT

A structure includes a laterally diffused (LD) MOSFET with an n-type drift region disposed on a surface of a substrate and a p-type body region contained in the drift region. The structure further includes an n-type source region contained in the p-type body region; an n-type drain region contained in the n-type drift region; a gate electrode disposed on a gate dielectric overlying a portion of the p-type body region and the n-type drift region and an electrically conductive field shield member disposed within the n-type drift region at least partially beneath the p-type body region and generally parallel to the gate electrode. The electrically conductive buried field shield member is contained within and surrounded by a layer of buried field shield oxide and is common to both a first LD MOSFET and a second LD MOSFET that are connected in parallel. Methods to fabricate the structure are also disclosed.

9 Claims, 7 Drawing Sheets

(51) Int. Cl.
  *H01L 21/336*  (2006.01)
  *G06F 17/50*  (2006.01)
  *H01L 27/088*  (2006.01)
  *H01L 29/739*  (2006.01)
  *H01L 29/40*  (2006.01)
  *H01L 29/10*  (2006.01)
  *H01L 21/265*  (2006.01)

(52) U.S. Cl.
  CPC .......... *H01L 29/401* (2013.01); *H01L 29/404* (2013.01); *H01L 29/408* (2013.01); *H01L 29/66681* (2013.01); *H01L 29/66689* (2013.01); *H01L 29/7816* (2013.01); *H01L 29/665* (2013.01)

(58) Field of Classification Search
  CPC .............. H01L 29/66681–29/66704; H01L 29/7816–29/7826; H01L 29/402–29/407; H01L 29/063–29/0634; H01L 29/404
  USPC .................................................. 257/332–342
  See application file for complete search history.

(56) References Cited

U.S. PATENT DOCUMENTS

| | | | |
|---|---|---|---|
| 6,222,229 B1 | 4/2001 | Hebert et al. | |
| 7,768,064 B2 | 8/2010 | Sapp et al. | |
| 7,851,856 B2 | 12/2010 | Hebert et al. | |
| 8,102,012 B2 | 1/2012 | Peters et al. | |
| 8,198,677 B2 | 6/2012 | Wilson et al. | |
| 8,455,350 B2 | 6/2013 | DSeah Teo Leng | |
| 8,530,965 B2 | 9/2013 | Kim | |
| 8,546,880 B2 | 10/2013 | Lee et al. | |
| 2010/0078715 A1 | 4/2010 | Lee | |
| 2018/0012966 A1 | 1/2018 | Ning | |
| 2018/0047816 A1 | 2/2018 | Ning | |
| 2018/0047817 A1* | 2/2018 | Ning | H01L 21/265 |

OTHER PUBLICATIONS

P. Moens et al., "Hot hole degradation effects in lateral nDMOS transistors," IEEE Transactions on Electron Devices, vol. 51, No. 10, 2004, pp. 1704-1710.

Fairchild Semiconductor Corporation, "AN-6099 New PowerTrench® MOSFET with Shielded GateTechnology Increases System Efficiency and Power Density in Synchronous Rectification Applications", Rev. 1.0.1, Mar. 12, 2013, whole document (11 pages).

List of IBM Patents or Patent Applications Treated as Related, 2 pgs.

* cited by examiner

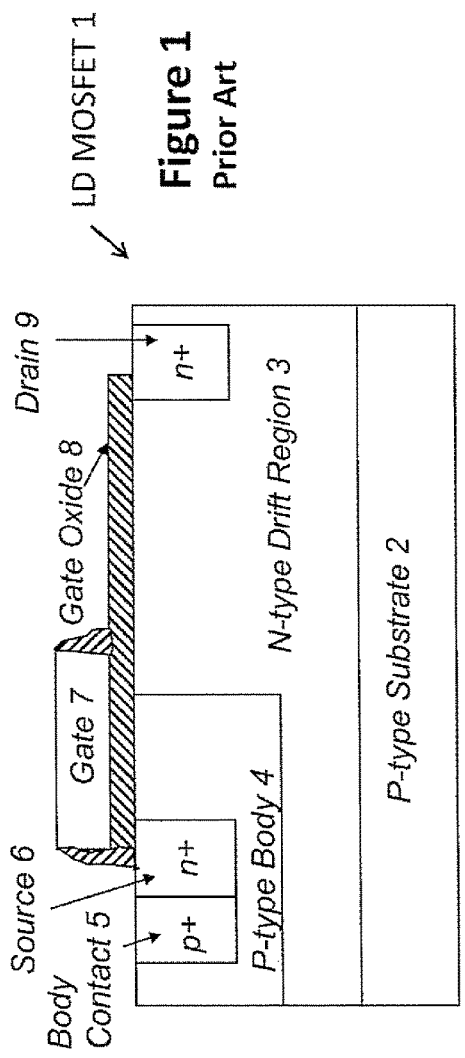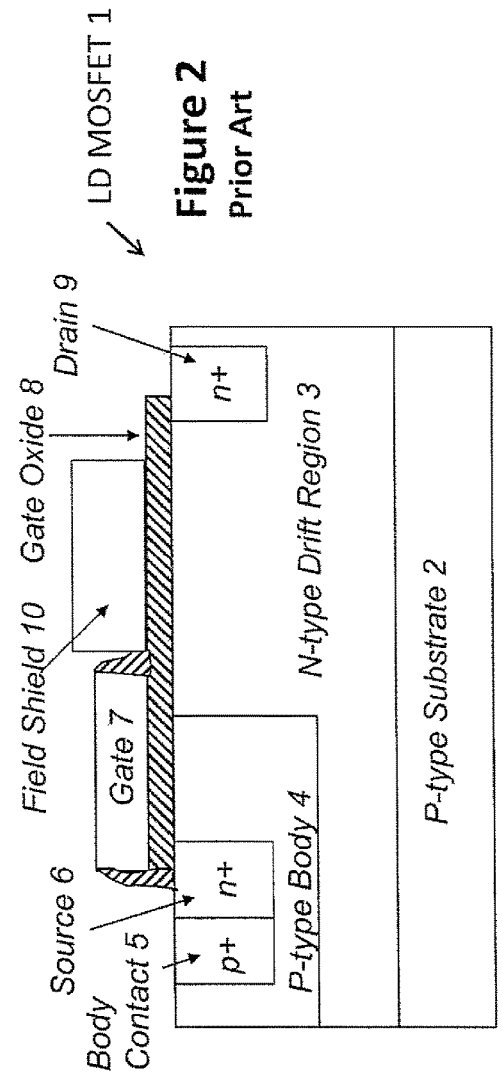

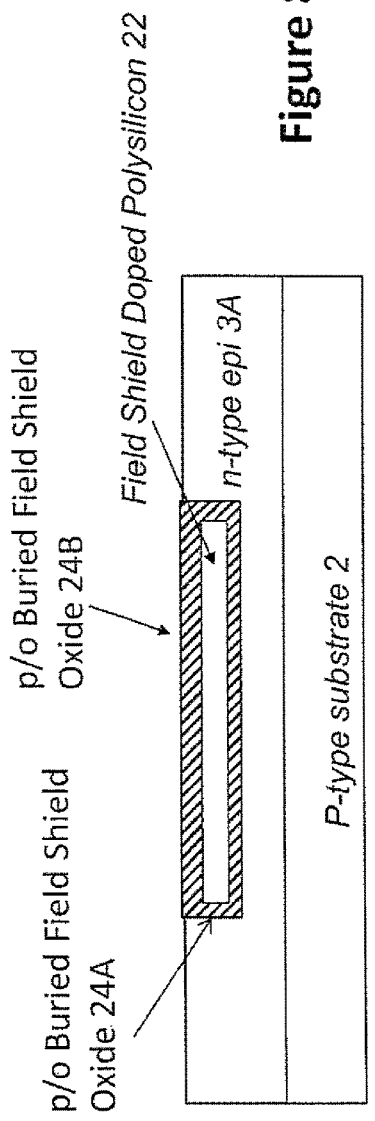
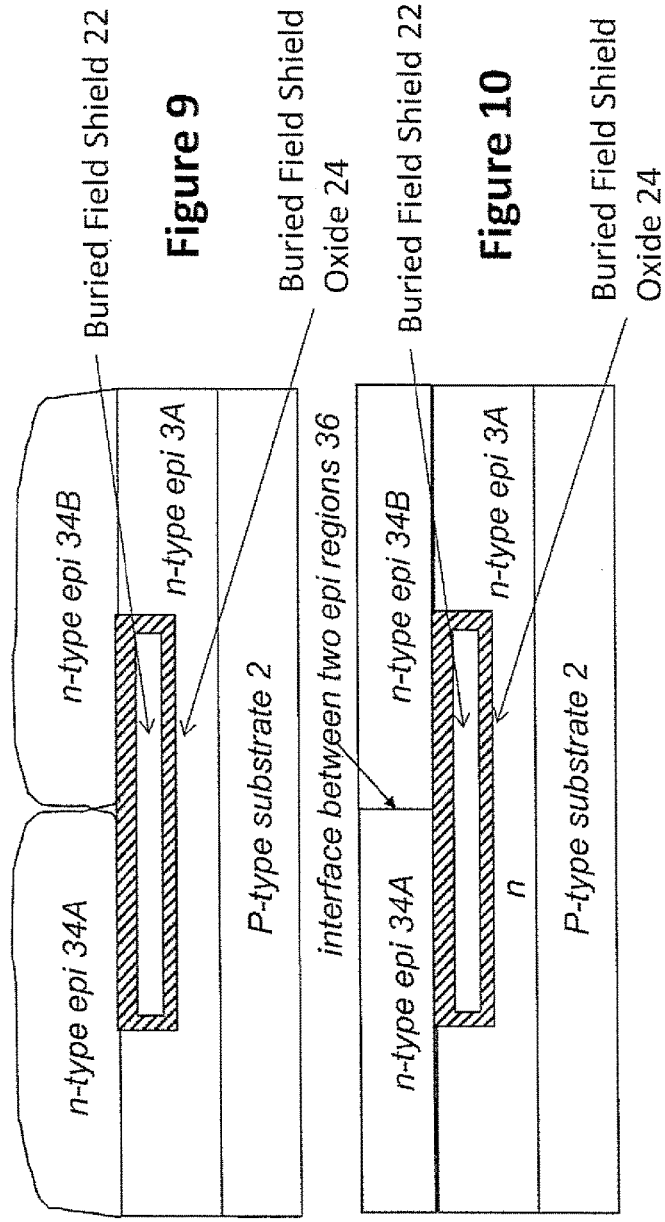

HIGH VOLTAGE LATERALLY DIFFUSED MOSFET WITH BURIED FIELD SHIELD AND METHOD TO FABRICATE SAME

CROSS REFERENCE TO RELATED APPLICATION

This patent application is a divisional patent application of copending U.S. patent application Ser. No. 15/205,043, filed Jul. 8, 2016, the disclosure of which is incorporated by reference herein in its entirety.

TECHNICAL FIELD

The various embodiments of this invention relate generally to semiconductor devices and fabrication techniques, to metal oxide semiconductor field effect transistors (MOSFETs) and, more specifically, relate to laterally diffused (LD) MOSFETs that include a gate field shield and that are capable of operation at higher voltage potentials than conventional logic MOSFETs.

BACKGROUND

High voltage MOSFET devices typically suffer from large avalanche multiplication when the transistor is in use, especially when the transistor is biased in the off state or in the weakly-on state. Large avalanche multiplication leads to device degradation due to hot-carrier injection into the gate oxide. Hot carrier injection into the gate oxide, especially hot hole injection into the gate oxide, can result in the weakening of the gate oxide which eventually leads to device failure.

SUMMARY

In a first aspect thereof the embodiments of this invention provide a structure that comprises a laterally diffused MOSFET comprising an n-type drift region disposed on a surface of a substrate and a p-type body region contained in the n-type drift region; an n-type source region contained in the p-type body region; an n-type drain region contained in the n-type drift region; a gate electrode disposed on a gate dielectric overlying a portion of the p-type body region and the n-type drift region; and an electrically conductive field shield member disposed within the n-type drift region at least partially beneath the p-type body region and generally parallel to the gate electrode.

In another aspect thereof the embodiments of this invention provide a structure that comprises a first laterally diffused MOSFET comprising a first portion of an n-type drift region disposed on a surface of a substrate and a first portion of a p-type body region contained in the n-type drift region; an n-type source region contained in the first portion of the p-type body region; an n-type drain region contained in the first portion of the n-type drift region; a first gate electrode disposed on a first gate dielectric overlying the first portion of the p-type body region and the first portion of the n-type drift region. The structure further comprises a second laterally diffused MOSFET comprising a second portion of the n-type drift region disposed on the surface of the substrate and a second portion of a p-type body region contained in the n-type drift region; an n-type source region contained in the second portion of the p-type body region; an n-type drain region contained in the second portion of the n-type drift region; and a second gate electrode disposed on a second gate dielectric overlying the second portion of the p-type body region and the second portion of the n-type drift region. In the structure there is a common electrically conductive buried field shield member disposed within both the first and the second portions of the n-type drift region at least partially beneath the first and the second portions of the p-type body region and generally parallel to each of the first and the second gate electrodes, and also a common p-type body contact region disposed between and electrically connected to the first portion of the p-type body region and the second portion of the p-type body region for connecting in parallel the first laterally diffused MOSFET and the second laterally diffused MOSFET.

In a further aspect thereof the embodiments of this invention provide a method to fabricate laterally diffused MOSFETs. The method comprises providing a semiconductor substrate having disposed over a top surface thereof a bottom surface of an n-type layer; forming a recess in a top surface of the n-type layer; forming in the recess an electrically conductive field shield member covered with a dielectric material; epitaxially growing in vertical and lateral directions from the top surface of the n-type layer additional n-type semiconductor material so as to completely bury the electrically conductive field shield member and dielectric material, where the n-type layer and the additional n-type semiconductor material are doped for forming n-type drift region; forming, in the n-type drift region, a p-type body region overlying the buried electrically conductive field shield member and dielectric material and forming first and second n+ drain regions; forming, in the p-type body region, first and second n+ source regions and a p+ body contact region overlying the buried electrically conductive field shield member and dielectric material and depositing first and second gate dielectrics and gate electrodes so as to overly a portion of the p-type body region and the n-type drift region. In the method a first gate electrode is disposed on the first gate dielectric associated with a first laterally diffused MOSFET and a second gate electrode is disposed on the second gate dielectric associated with a second laterally diffused MOSFET.

BRIEF DESCRIPTION OF THE SEVERAL VIEWS OF THE DRAWINGS

Certain ones of the Figures are enlarged cross-sectional views showing various initial, intermediate and completed or substantially completed structures wherein the various layer thicknesses and other dimensions are not necessarily drawn to scale. More specifically:

FIG. 1 illustrates a typical LDMOS (LD MOSFET) device constructed using silicon technology;

FIG. 2 illustrates the LD MOSFET device of FIG. 1 with a conventional field shield over an n-type drift region adjacent to a gate electrode to reduce a peak electric field near a silicon/oxide interface;

FIGS. 5-12 illustrate a non-limiting example of a process flow suitable to fabricate the LD MOSFET device shown in FIG. 4, wherein:

FIG. 5 shows a side cross-sectional enlarged view of a starting structure containing a p-type Si substrate and an overlying n-type epitaxial (epi) Si layer;

FIG. 6 shows the structure of FIG. 5 after forming a hardmask layer on the n-type epi layer and opening an aperture to form a recess that will contain the buried field shield and surrounding shield dielectric (e.g., oxide);

FIG. 7 shows the structure of FIG. 6 after forming a layer of $SiO_2$ that will be part of the buried field shield oxide;

FIG. 8 shows the structure of FIG. 7 after some further processing to deposit the field shield conductor, a planarization step, the growth of an additional layer of $SiO_2$ to form the top portion of the buried field shield oxide, and stripping the hardmask;

FIG. 9 shows the structure of FIG. 8 after vertical and lateral epitaxial growth of additional n-type Si on the already present n-type epi to cover the buried field shield completely;

FIG. 10 shows the structure of FIG. 9 after planarizing the surface and thinning the additional n-type Si epi above the buried field shield and associated buried field shield oxide;

FIG. 11 shows the structure of FIG. 10 after further processing to provide a pair of LD MOSFETs connected in parallel via the p+ body contact that share the common buried field shield; and FIG. 12 shows the structure of FIG. 11 after further (optional) processing to provide top surface field shields as well as a layer of silicide that functions as a conductive strap to electrically connect the two LD MOSFETs in parallel.

DETAILED DESCRIPTION

Figure 3:
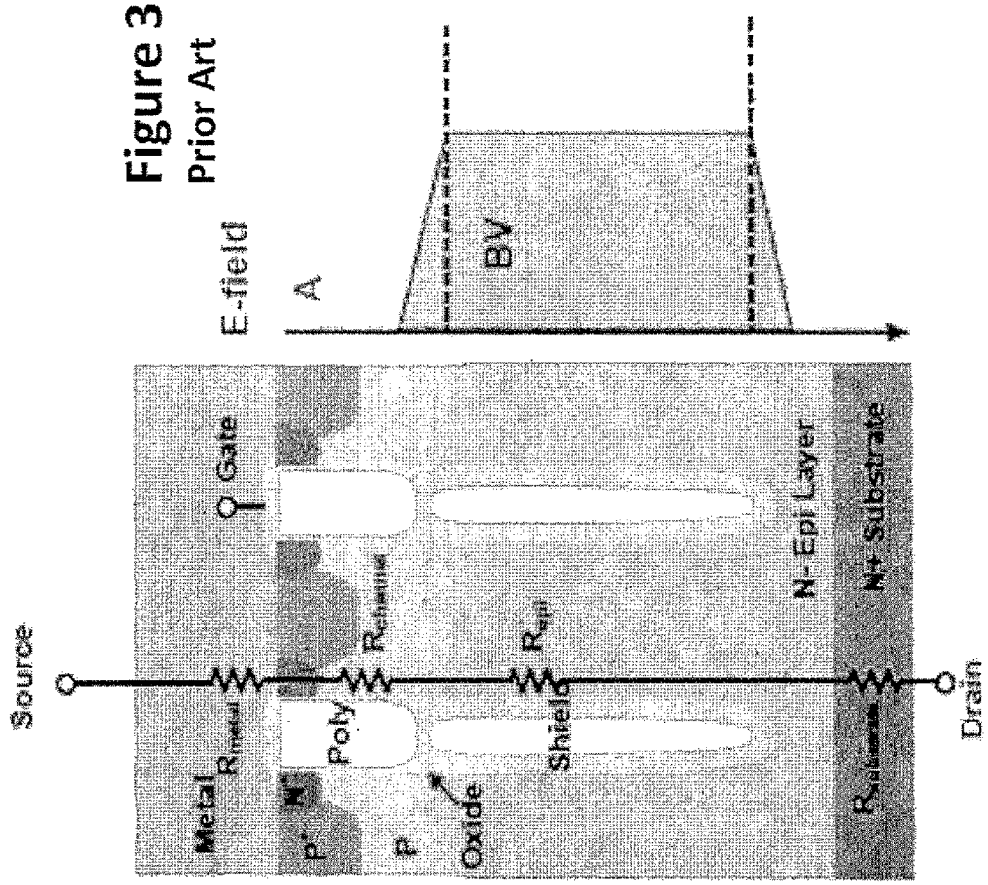
FIG. 3 illustrates an example of a conventional high voltage vertical FET constructed using trench technology.

It is a feature and an aspect of the embodiments of this invention to add a buried field shield to a high voltage planar laterally diffused MOSFET device in order to reduce an occurrence of avalanche multiplication and thereby reduce the potential for device failure.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LP-CVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 300° C. to about 900° C. Although higher temperature will typically result in faster deposition of the semiconductor material, the faster deposition may also result in crystal defects and film cracking.

Unless expressly indicated differently any references to a "top surface" herein imply a direction away from some surface that would support a wafer substrate, while any references to a "bottom surface" imply a direction towards the surface that would support the wafer substrate.

FIG. 1 illustrates a typical LDMOS (LD MOSFET) device 1 constructed using silicon technology. The LDMOS 1 is a high-voltage MOSFET where a p-type body 4 determines the threshold voltage of the MOSFET. A threshold voltage in a range of about 0.5V to about 1V is typical. The corresponding doping concentration can be, for example, in a range of about $10^{17}$ to mid-$10^{18}$ atoms/$cm^3$. The p-type body 4 is disposed adjacent to an n-type drift region 3 that in turn is disposed on a surface of a p-type substrate 2 (e.g., a Si wafer doped in a range of about $10^{16}$ to about $10^{17}$ atoms/$cm^3$). In the p-type body 4 there is a p+ body contact 5 and an n+ source 6. An electrically conductive gate electrode 7 (e.g., doped polysilicon and/or metal) and gate oxide 8 (e.g., $SiO_2$) are disposed on the surface of the p-type body 4 and the n-type drift region 3. An n+ drain 9 is formed in the n-type drift region 3. The p+ body contact 5, n+ source 6 and n+ drain 9 can each be doped at about $10^{20}$ (or higher) atoms/$cm^3$. In operation the n-type drift region 3 can be viewed as functioning as a lightly doped part of the drain 9. In operation, and when the LD MOSFET device 1 is off, most of the drain voltage is dropped across the n-type drift region 3.

To enhance the integrity of the gate oxide 8 a step-oxide structure can be used, where the gate oxide 8 is made thinner at the source end and thicker at the drain end of the LD MOSFET device 1.

Two (conflicting) design constraints for the n-type drift region 3 are that:
the n-type drift region 3 should be lightly doped to minimize the peak electric field and avalanche multiplication when the LD MOSFET device 1 is off or weakly on; and
the n-type drift region 3 should be at least moderately doped to minimize the drain region series resistance when the LD MOSFET device 1 is turned on.

One challenge that is presented is thus to have the n-type drift region 3 moderately doped while still experiencing low avalanche multiplication when the voltage potential drain-to-source (Vds) is large (when the device is turned off).

Referring to FIG. 2, the addition of a field shield 10 (a conductive material) over the n-type drift region 3 next to the gate electrode 7 has the effect of reducing the peak electric field near the silicon/oxide interface. The field shield 10 can be electrically floating or it could be tied to a potential, e.g., the potential of the source 6. A net result is reduced avalanche multiplication, enabling the LD MOSFET device 1 to operate at larger Vds values.

FIG. 3 illustrates an example of a high voltage vertical FET (not a laterally diffused FET) constructed using trench technology. In the illustrated vertical FET a floating field shield is provided to reduce the peak electric field and hence suppress avalanche multiplication.

Figure 4:
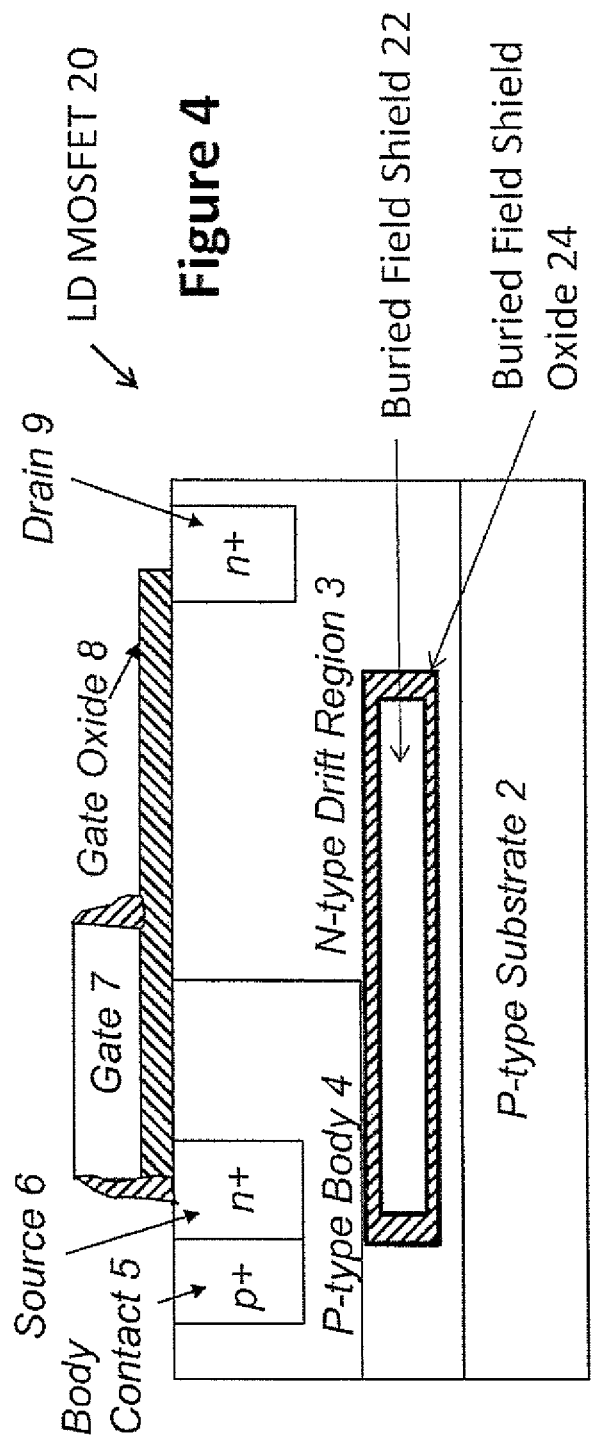
FIG. 4 shows an embodiment of a LD MOSFET device in accordance with embodiments of this invention, where the device includes an electrically conductive and electrically floating buried field shield contained in a dielectric insulator.

Reference is now made to FIG. 4 for showing an embodiment of a LD MOSFET device 20 in accordance with embodiments of this invention, where the device 20 includes in some embodiments an electrically conductive, electrically floating buried field shield 22 contained in a dielectric insulator 24 (e.g., $SiO_2$) to reduce the peak electric field in the device and hence suppress avalanche multiplication. The buried field shied 22 can be used alone or in combination with a top surface conventional field shield 10 shown in FIG. 2. The buried field shield 22 is a substantially planar electrically conductive member (e.g., doped polysilicon) that is disposed within the n-type drift region 3 at least partially beneath the gate region and generally parallel to the gate electrode 7. The buried field shield 22 can have a thickness in a range of, for example, about 50 nm to about 200 nm. As was noted the LD MOSFET device 20 may or may not also include the conventional gate field shield 10 that is shown in FIG. 2. In other embodiments of this invention, and instead of being electrically floating, the buried field shield 22 can be tied to some potential. For example, the buried field shield 22 can be tied to the source 6.

Reference is now made to FIGS. 5-11 for illustrating a non-limiting example of a process flow suitable to fabricate the LD MOSFET device 20 having the buried field shield 22 (actually to fabricate two LDMOS devices connected in parallel having a common buried field shield 22).

Figure 5:
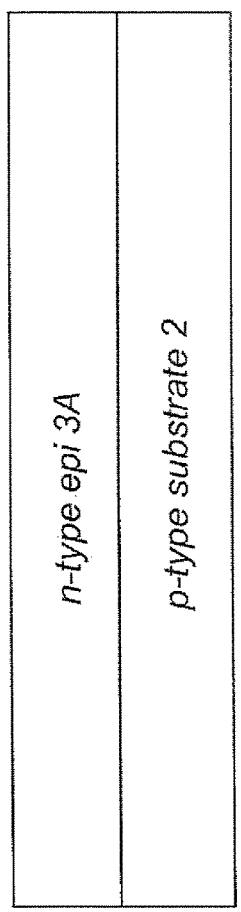

FIG. 5 shows a side cross-sectional enlarged view of a starting structure containing the p-type Si substrate 2 (e.g., Boron-doped bulk Si) and an overlying n-type epitaxial (epi) Si layer 3A. The n-type epi layer 3A can be formed by any suitable epitaxial growth process such as CVD and MBE, and can be considered to be a precursor layer of the n-type drift region 3 shown in FIG. 4. The thickness of the n-type epi layer 3A can be in a range of, for example, 0.5 μm and thicker (e.g., about 5 μm). The n-type epi layer 3A can be relatively lightly doped with any suitable n-type dopant such as arsenic or phosphorus and can have a dopant concentration in a range of, for example, about $10^{16}$ to $10^{17}$ atoms/cm$^3$. Lower dopant concentrations (e.g., about $5\times10^{15}$ atoms/cm$^3$) can be employed for devices that will be used with higher voltages. In this context high voltage(s) can be assumed to be a voltage(s) greater than those typically used for logic device applications (e.g., about 1.5V).

While the ensuing description will be made in the context of a Si-based LD MOSFET device in other embodiments of this invention other semiconductor materials can be used, preferably large bandgap materials such as any of a number of Group III-V materials (e.g., GaAs, GaAlAs, etc.,).

Figure 6:
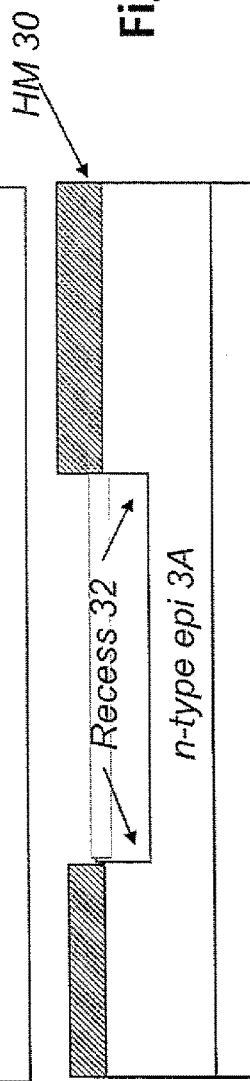

FIG. 6 shows the structure of FIG. 5 after forming a hardmask (HM) layer 30 (e.g., a nitride) on the surface of the n-type epi layer 3A, applying a mask to define where the buried field shield 22 will be located, and then opening an aperture through the HM 30 and partially through the n-type epi layer 3A to form a recess 32 that will contain the buried field shield 22 and its surrounding oxide 24. Any suitable material removal process can be used for forming the recess 32 including wet chemical etching, ion milling, plasma etching and reactive ion etching (RIE) as a few examples, so long as the selected material for the HM 30 can withstand the material removal process.

Figure 7:
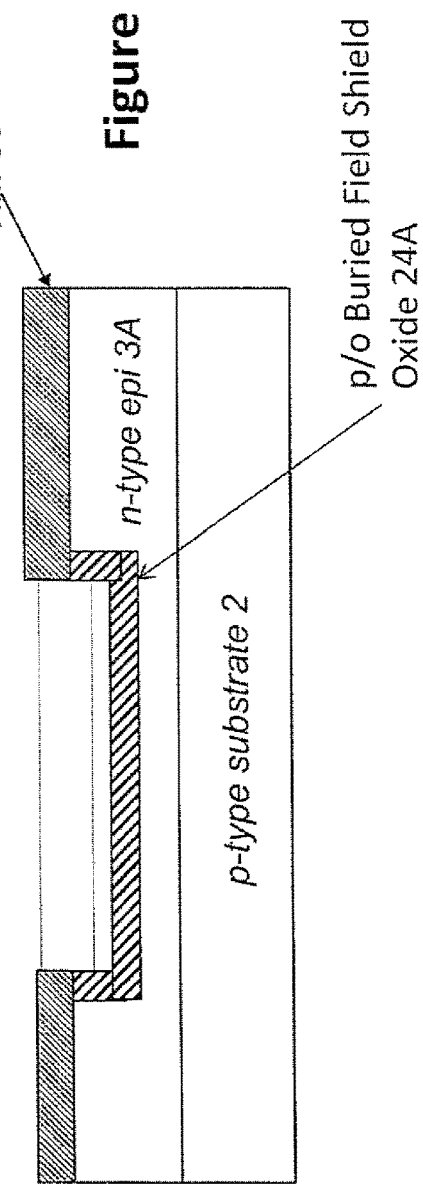

FIG. 7 shows the structure of FIG. 6 after forming a layer of $SiO_2$ 24A that will be part of the buried field shield oxide 24. In this embodiment the $SiO_2$ 24A can be formed by a thermal oxidation process that consumes some portion of the Si exposed on the sidewalls and bottom of the recess 32 leaving behind the layer of $SiO_2$. The layer of $SiO_2$ can have a thickness of, for example, about 20 nm to about 50 nm and will function to electrically insulate and isolate the subsequently formed buried field shield conductor 22 from the surrounding semiconductor material.

FIG. 8 shows the structure of FIG. 7 after the performance of several fabrication steps. First there is deposited the field shield conductor 22 that in this non-limiting embodiment of the invention is comprised of n-type doped polysilicon (doped with any suitable n-type dopant such as Arsenic or Phosphorus) to the desired thickness (e.g., a thickness in the range of, for example, about 50 nm to about 200 nm). The field shield conductor 22 is deposited so that a long axis thereof is generally parallel to the top surface of the n-type epi layer 3A. This is followed by a planarization step (e.g., a chemical-mechanical polish (CMP) process) to remove the deposited polysilicon everywhere except in the recessed region 32 where the buried shield field oxide 24A has been formed. An additional layer of $SiO_2$ is then deposited or grown to form the top portion 24B of the buried field shield oxide 24 that covers the deposited field shield doped polysilicon conductor 22. The field shield conductor 22 is preferably completely covered on all surfaces (top, bottom, end and side surfaces) with the dielectric material of the buried field shield oxide 24. The HM 30 is then stripped away leaving the structure illustrated in FIG. 8.

FIG. 9 shows the structure of FIG. 8 after the epitaxial growth of n-type Si epi 34A and 34B on the n-type epi 3A, where the newly grown n-type epi has the same doping characteristics as the previously from n-type epi 3A (e.g., an in situ doped dopant concentration in the range of about $10^{16}$ to $10^{17}$ atoms/cm$^3$). The growth of the additional n-type Si epi 34A, 34B proceeds both vertically and laterally until the lateral growth covers the buried field shield completely. The thickness of the n-type Si epi 34A, 34B can be in an exemplary range of about 0.5 μm to about 5 μm (it will be subsequently thinned). It is pointed out that the combination of the n-type epi 3A and the overlying n-type Si epi 34A, 34B forms the n-type drift region 3 that was shown in FIG. 4.

FIG. 10 shows the structure of FIG. 9 after planarizing the surface and thinning down the n-type Si epi 34A, 34B above the buried field shield 22 and associated buried field shield oxide 24 to the desired thickness for LDMOS device fabrication. Note that there will exist an interface 36 between the two n-type Si epi regions 34A, 34B resulting from the meeting of two lateral growth fronts during the epitaxial growth of the n-type Si epi 34A and 34B. However, as will be shown in FIG. 11 this interface region (interface 36) subsequently becomes a part of the p+ body contact 5 and thus any defect/discontinuity that may exist between the two n-type Si epi regions 34A, 34B does not adversely affect the device performance.

Figure 11:
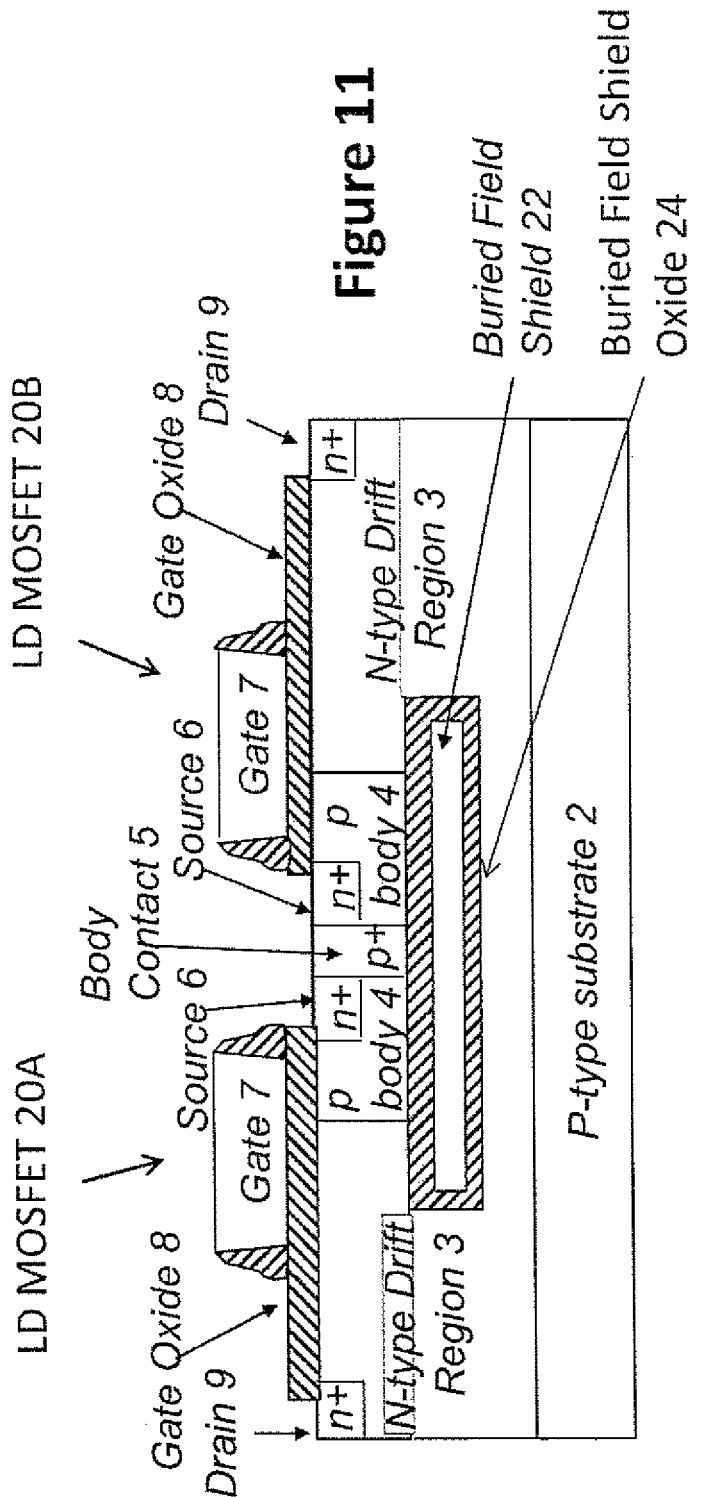

FIG. 11 shows the structure of FIG. 10 after further processing to provide a pair of LD MOSFETs 20A and 20B connected in parallel via the common p+ body contact 5. Each p-type body 4 is disposed adjacent to the n-type drift region 3 formed from the n-type epi 3A and the overlying n-type epi 32A, 32B. In each p-type body 4 there is the n+ source 6, and associated with each LD MOSFET 20 is the n+ drain 9. All of these various structures disposed in the n-type drift region 3 can be formed, for example, via ion implanting desired dopant species at the desired dopant concentrations. For example, the p+ body contact 5 can be Boron doped at about $10^{20}$ (or higher) atoms/cm$^3$, and the n+ source 6 and n+ drain 9 can each be Phosphorus or Arsenic doped at about $1\times10^{20}$ to about $4\times10^{20}$ (or higher) atoms/cm$^3$. The depth of each of the n+ source 6 and n+ drain 9 can be in a range of, for example, about 10 nm to about 50 nm. The gate dielectrics 8 can be an oxide as shown or a nitride and the gate electrodes 7 can be polysilicon and/or metal as was noted above.

The p+ body contact 5 can extend vertically from the top surface of the n-type drift region 3 to the buried field shield oxide 24 as shown, although this is not a requirement. Preferably the p+ body contact 5 extends completely through the interface region 36 between the two epi growth fronts (see FIG. 10).

Figure 12:
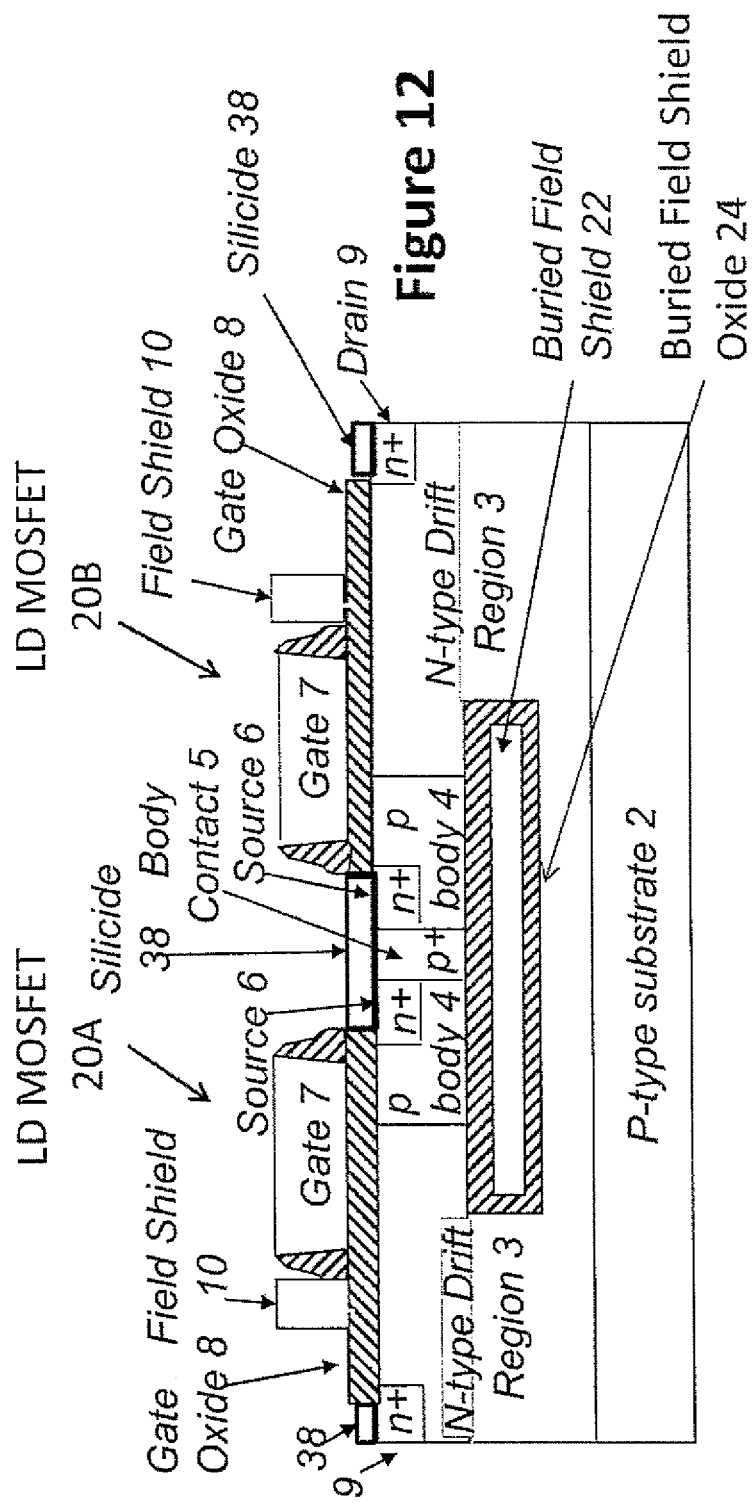

As is shown in FIG. 12 a layer of silicide 38 can be formed by a thermal process over the body contact 5, sources 6 and the drain regions 9. The silicide 30 over the body contact 5 and sources 6 short these features together and electrically connect the two LD MOSFET devices together in parallel. Furthermore, each of the two LD MOSFET devices 20A, 20B can optionally be provided with the conventional gate field shield 10 of the type shown in FIG. 2.

As can be seen in FIGS. 11 and 12 what is fabricated in accordance with embodiments of this invention are two LDMOS devices 20A, 20B that share the one common buried field shield 22, with the common p+ body contact 5 of the two LDMOS devices located at the interface 36 of the two lateral epi regions 32B thereby eliminating any potential for interface defects to effect device operation.

Processing can continue in a conventional manner, for example, to form one or more dielectric layers (e.g., an inter-layer dielectric (ILD) if not already present and back end of line (BEOL) dielectric layers), to form gate contacts and S/D contacts, and to form vertical and horizontal conductive interconnects, including connecting the buried field shield 22 to the sources 6 if desired, as is known in the art.

It is noted that any one of the structures shown in FIGS. 5-12 could be viewed as an intermediate structure formed during the overall process of providing the parallel connected pair of LD MOSFETs 20A and 20B.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and material removal processes may be used by those skilled in the art. Further, the exemplary embodiments of this invention are not intended to be limited to only those semiconductor materials, conductors, insulators, dopants, dopant concentrations, layer thicknesses and the like that were specifically disclosed above. Any and all such and similar modifications of the teachings of this invention will still fall within the scope of this invention.

What is claimed is:

1. A method to fabricate laterally diffused MOSFETs comprising:

providing a semiconductor substrate having disposed over a top surface thereof a bottom surface of an n-type layer;

forming a recess in a top surface of the n-type layer;

forming in the recess an electrically conductive field shield member covered completely with a dielectric material;

epitaxially growing in vertical and lateral directions from the top surface of the n-type layer additional n-type semiconductor material so as to completely bury the electrically conductive field shield member and dielectric material, where the n-type layer and the additional n-type semiconductor material are doped for forming an n-type drift region;

forming, in the n-type drift region, a p-type body region overlying the buried electrically conductive field shield member and dielectric material and forming first and second n+drain regions;

forming, in the p-type body region, first and second n+source regions and a p+body contact region overlying the buried electrically conductive field shield member and dielectric material; and depositing first and second gate dielectrics and gate electrodes so as to overly a portion of the p-type body region and the n-type drift region, where a first gate electrode is disposed on the first gate dielectric associated with a first laterally diffused MOSFET and where a second gate electrode is disposed on the second gate dielectric associated with a second laterally diffused MOSFET.

2. The method as in claim 1, where a long axis of the electrically conductive field shield member is generally parallel to the top surface of the n-type layer.

3. The method as in claim 1, further comprising siliciding at least a portion of the first and second n+ source regions and the p+ body contact region for electrically coupling them together to connect in parallel the first laterally diffused MOSFET and the second laterally diffused MOSFET.

4. The method as in claim 1, where the n-type layer and the additional n-type semiconductor material are doped with a concentration in a range of about $10^{16}$ atoms/cm$^3$ to about $10^{17}$ atoms/cm$^3$.

5. The method as in claim 1, where the n-type layer and the additional n-type semiconductor material are doped with a concentration in a range of about $10^{16}$ atoms/cm$^3$ to about $10^{18}$ atoms/cm$^3$.

6. The method as in claim 1, where the p-type body region is formed by implanting a p-type dopant into the n-type drift region with a concentration in a range of about $10^{17}$ atoms/cm$^3$ to mid-$10^{18}$ atoms/cm$^3$.

7. The method as in claim 1, where the buried electrically conductive field shield member is common to both the first laterally diffused MOSFET and the second laterally diffused MOSFET.

8. The method as in claim 1, where the buried electrically conductive field shield member is one of electrically floating or tied to a predetermined voltage potential.

9. The method as in claim 1, further comprising forming at least one second electrically conductive field shield member over the n-type drift region next to the gate electrode.

\* \* \* \* \*